United States Patent

Carbrey

[15] 3,653,035

[45] Mar. 28, 1972

[54] CHORD LAW COMPANDING PULSE CODE MODULATION CODERS AND DECODERS

[72] Inventor: Robert Lawrence Carbrey, Boulder, Colo.

[73] Assignee: Bell Telephone Laboratories, Incorporated, Murray Hill, N.J.

[22] Filed: Apr. 24, 1970

[21] Appl. No.: 31,489

[52] U.S. Cl................340/347 C, 340/347 AD, 340/347 DA

[51] Int. Cl........................................................H03k 13/02

[58] Field of Search.......................................340/347 C, 347

[56] References Cited

UNITED STATES PATENTS 3,449,741 6/1969 Egerton.............................340/347 C 3,216,002 11/1965 Hoffman...........................340/347 C 3,462,759 8/1969 Hoffman...............................340/347

*Primary Examiner*—Maynard R. Wilbur

*Assistant Examiner*—Jeremiah Glassman

*Attorney*—R. J. Guenther and E. W. Adams, Jr.

[57] ABSTRACT

Capacitive voltage division and capacitive charge redistribution techniques are used in a pulse coding arrangement which selects a segment of the signal range in which an analog sample occurs. The charge on a series divider is periodically compared with the analog sample, and stored charge is subsequently redistributed in accordance with the comparison results. The invention produces a chord law characteristic, and is suitable for operation with PCM coders or decoders.

4 Claims, 4 Drawing Figures

INVENTOR
R. L. CARBREY
BY
ATTORNEY

CHORD LAW COMPANDING PULSE CODE MODULATION CODERS AND DECODERS

BACKGROUND OF THE INVENTION

This invention relates to digital transmission systems. More particularly, it relates to linear and companded pulse code modulation systems.

In pulse code modulation (PCM) analog signals are prepared for transmission by converting them to binary signals. This conversion is accomplished by encoding individual samples of the analog signal as groups of binary data, known as words. Each digital word therefore comprises a series of "1's" or "0's;" usually each digit of a word corresponds to some predetermined level in the analog sample range. For example, if a digit is a "1," it might indicate that the analog signal is greater than the corresponding level, and conversely if the digit is a "0," it would indicate that the sample is smaller than the corresponding level.

In practice, these levels are distributed through the analog sample range in several ways. The simplest distribution is the so-called linear distribution, where the levels are evenly spaced through the signal range. Linear distributions, however, have the serious disadvantage of causing encoding error to be unevenly distributed, with serious encoding degradation at the lower signal levels. To remedy this problem, many PCM converters employ an uneven (hyperbolic, logarithmic, etc.) distribution of levels. These converters, knows as companded (i.e., volume compressed and expanded) converters, usually concentrate more levels in the lower signal amplitude range than in the higher amplitude ranges. In this manner, on the average, error is relatively minimized over the entire signal range. However, companded converters trade off accuracy in the large signal range for this overall improvement.

Both the linear and the companded converters, therefore, suffer from a degree of encoding error, the linear converters in the small signal range and the companded converters in the large signal range. This error is inherent to the conversion schemes.

SUMMARY OF THE INVENTION

The present invention is a means for minimizing the error inherent in these converting schemes. By finding an amplitude range within which the analog sample occurs before the sample is transmitted to the PCM converter, the invention places absolute limits upon the degree of conversion error which is possible. Through the operation of the present invention, the analog sample is only presented to the PCM encoder after the reference voltage to the encoder has been adjusted to an approximation of the analog signal sample. Thus, the present invention, as a pre-encoding signal processor, obtains substantial improvement in encoding accuracy. Similarly, the application of the principles of the present invention to PCM decoders enables a substantial improvement in decoding accuracy.

In an illustrative embodiment of the present invention, a capacitive series voltage divider is connected by switches to a reference voltage source and to a parallel capacitor. The intermediate voltage from the capacitive divider is periodically compared with an analog sample, and the "parallel" capacitor is switched either to ground or to the capacitive divider in response to these comparisons. Whenever the "parallel" capacitor is connected with the divider, charge redistributes between them; otherwise, it is discharged. The switching of the "parallel" capacitor is encoded and transmitted as digital data and the voltage at the top and bottom of the top capacitor of the divider is transmitted to a PCM encoder (or decoder) for use as a reference voltage. The process utilized by the present invention is especially amenable to PCM converters of the class described in the copending patent applications of R.L. Carbrey Ser. Nos. 889,399 and 889,398 filed on Dec. 31, 1969.

It is a feature of the present invention that charge redistribution between parallel capacitors and capacitive voltage division is utilized to obtain a piecewise linear segmented encoding characteristic. Moreover, the use of capacitors allows for operation substantially independent of switched impedances and the like. It is another feature that the present invention automatically scales reference voltages for PCM encoders in proportion to individual analog signal samples. Still another feature of the present invention is that the segmented characteristic is given a logarithmic, or chord law, shape. These and other features of the present invention will be more clearly understood when considered in conjunction with the following detailed description.

DETAILED DESCRIPTION

Figure 1A:
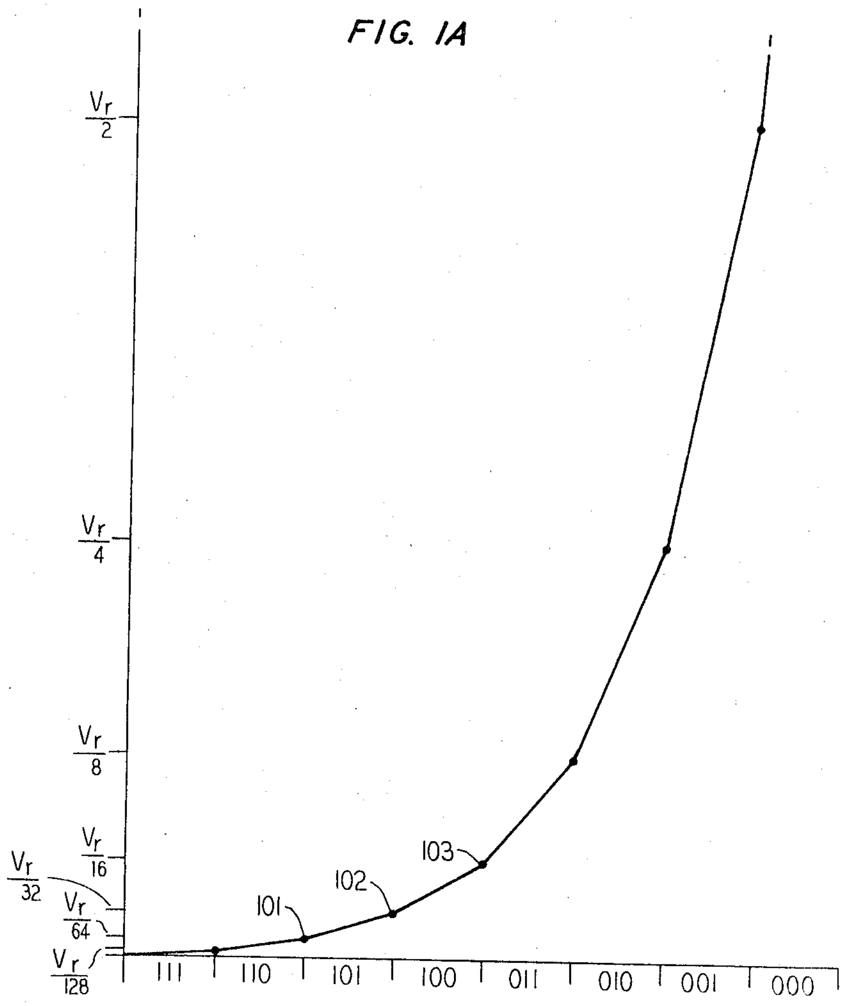
FIG. 1A is a graph showing a segmented chord law characteristic.
Figure 1B:
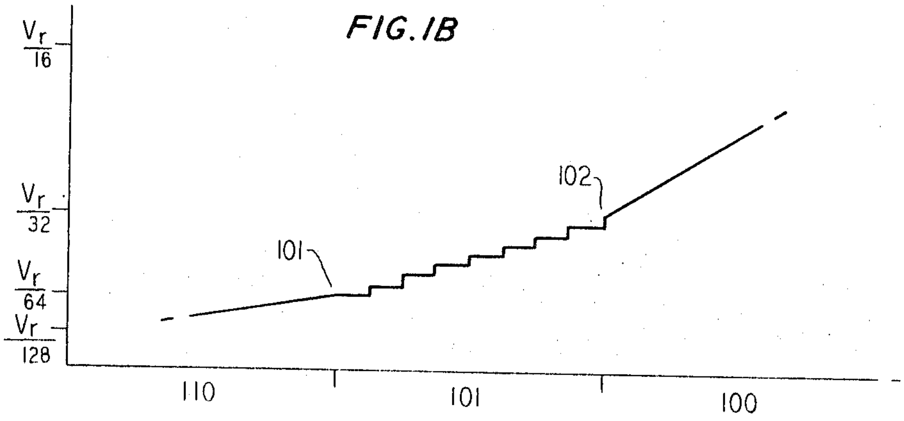
FIG. 1B shows a portion of the graph of FIG. 1A.

FIG. 1A shows a diagram of the segmented characteristic which is utilized by the present invention. This shape of segmented characteristic is commonly known as a chord law characteristic. The ordinate of FIG. 1A represents the input (or output) analog sample level and the abscissa represents the various code combinations. The principal distinguishing characteristic of the chord law function is that each successive break point 101, 102, 103, etc., between the various linear segments, is twice the magnitude of the preceding break point. The individual linear segments are therefore each double the slope of the preceding segment. In this manner, the lower level samples are accorded somewhat greater emphasis than the higher level signals, thereby obtaining the advantages of companded converters, even if the associated PCM converter is a linear converter. The present invention functions to denote exactly the piecewise linear segment in the chord law characteristic of FIG. 1A in which the analog sample occurs. Then, cognizant of this information, the PCM converter breaks up the particular indicated segment into the aforementioned levels. For example, FIG. 1B shows a portion of the characteristic of FIG. 1A after it has been divided into eight levels by a PCM converter. It is noteworthy that the characteristic of FIG. 1A is unipolar; in practice, the present invention produces a symmetric bipolar characteristic.

The operation of the invention, then, proceeds as follows. Each time an analog sample is delivered to a "precoding circuit" comprising the present invention, the invention finds the segment of the characteristic of FIG. 1A in which the sample occurs. A digital code representing that particular sample is then produced and transmitted. In addition, upper and lower limit voltages representing the break points of the segmented characteristic are connected to the PCM converter. The converter subdivides the designated segment into levels, as is shown in FIG. 1B, and appropriately encodes or decodes the analog sample within the given segment.

Figure 2:
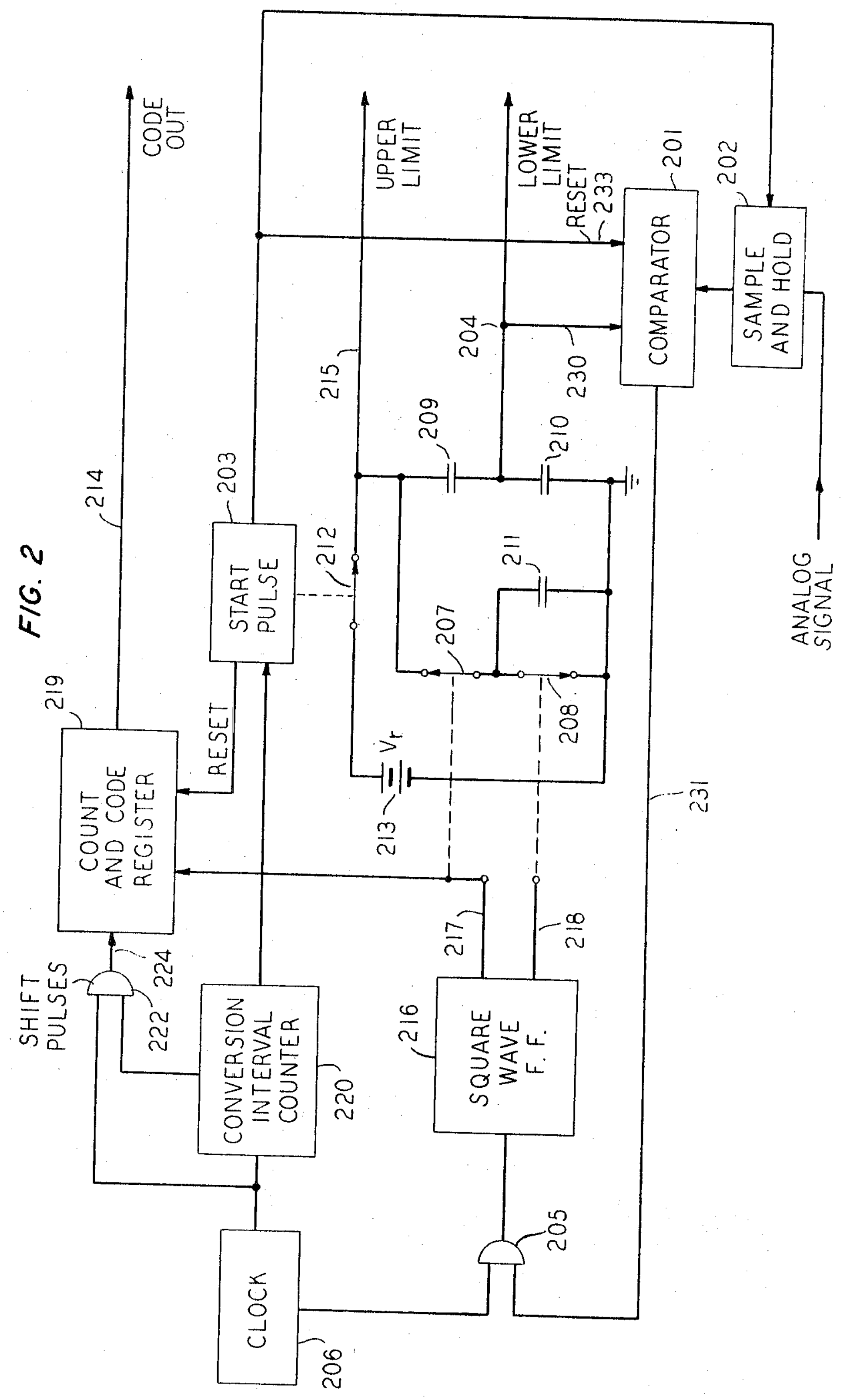
FIG. 2 is a schematic diagram of an illustrative embodiment of the present invention for use with PCM encoders.

FIG. 2 shows a schematic diagram of an illustrative embodiment of the invention which is designed for operation with PCM encoders. Analog samples are received by a comparator 201 from a sample and hold circuit 202. The comparator 201 compares the sample voltage with a lower limit voltage from output lead 204. In response to these comparisons, signals from the comparator 201 are gated by means of AND gate 205 with pulses from a clock 206. In addition, the clock pulses are transmitted to the start pulser 203 through a conversion interval counter 220. In response to signals from AND gate 205, a square wave flip-flop 216 controls a pair of switches 207 and 208 as well as a count and code register circuit 219. The operation of the switches 207 and 208 determines whether a capacitive series divider comprising capacitors 209 and 210 is to be connected in parallel with capacitor 211 or whether capacitor 211 is to be discharged to ground. In addition, another switch 212, operating under the control of the start pulser 203, connects the capacitive series divider of capacitors 209 and 210 with a reference voltage source 213. Binary code is produced by the count and code register 219 and is shifted out to the transmission medium via code output lead 214. The reference voltages representing the segment break points of FIG. 1A are designated as the voltages at the upper limit lead 215 and the lower limit lead 204. Count and code register 219 is also operated by pulses from a shift pulse gate 222 whenever the gate 222 is enabled by a clock pulse and a pulse from the conversion interval counter 220.

The operation of the embodiment of FIG. 2 proceeds as follows. At the beginning of each encoding cycle, a new analog sample is presented to comparator 201 from the sample and hold circuit 202, switches 212 and 208 are closed, switch 207 is opened, and the count and code register 219 is reset. Thus, at the beginning of each coding cycle, capacitor 211 is discharged and the capacitive divider comprising capacitors 209 and 210 is charged to the voltage of the reference voltage source 213, designated as $V_r$. The chord law characteristic of FIG. 1A may be obtained if capacitors 209, 210, and 211 are valued at 2C, 2C, and C, respectively, where C is some arbitrary unit capacitance. Thus, when the capacitive divider is charged to $V_r$, the voltage at the upper limit lead 215 is $V_r$ and the voltage at the lower limit lead 204 is charged to $\frac{1}{2}V_r$.

The comparator 201 may be embodied as a bistable (two output levels) circuit, with one output level, the "low" level, representing the situation when the sample voltage is greater than the lower limit voltage at lead 204, and the other output level, the "high" level, representing the situation when the lower limit voltage at lead 204 is greater than the analog sample voltage. The comparator 201 functions by comparing the voltages at its two inputs 202 and 204, and maintaining its output voltage in response to the relative values of the inputs. The output voltage of the comparator 201 is changed only when the relative magnitudes of the input voltages change. Thus, at the beginning of a coding cycle, a new analog input sample is introduced under the control of the start pulser 203, and the start pulser 203 emits a control pulse to switch 212 and to the comparator 201. Switch 212 is thereby momentarily closed, charging the capacitive divider, and is then opened and remains so for the rest of the encoding cycle. Since the voltage at the lower limit lead 204 is initially $\frac{1}{2}V_r$, this is the first voltage with which the sample is compared. The comparator 201 makes the comparison, and its output voltage is set accordingly.

AND gate 205 is enabled whenever a pulse is received from the clock 206 and the output of the comparator 201 is in its high state (indicating that the lower limit voltage is greater than the analog sample voltage). Whenever the output voltage of the comparator 201 is changed to its low state (indicating that the analog sample is greater than the lower limit voltage), the possibility of AND gate 205 being enabled is eliminated.

Whenever the AND gate 205 is enabled by the combination of a high voltage from the comparator with a pulse from the clock, the square wave flip-flop 216 is toggled such that the voltage at its output lead 217 is high and the voltage at its other output lead 218 is low, thereby closing switch 207 and opening switch 208. The next clock pulse through enabled AND gate 205 toggles flip0flop 216 to the state where the voltage at output lead 218 is high, thereby closing switch 208 and opening switch 207.

Whenever, therefore, switch 207 is closed and switch 208 is opened, capacitor 211 is connected in parallel with the switched divider of capacitors 209 and 210. This allows charge to redistribute from the charged capacitive divider to the uncharged capacitor 211. Due to the aforementioned choice of capacitance values, the voltage which finally settles across the parallel combination is one-half the voltage to which the capacitive divider was previously charged. For example, at the beginning of the operation, the voltage to which the capacitive divider had previously been charged, $V_r$, is halved, and the voltage on capacitor 211 becomes $V_r/2$. Thus, the lower limit voltage at lead 204 is also halved by means of the redistribution process, and becomes $\frac{1}{4}V_r$. Each time the state of the output lead 217 of the square wave flip-flop 216 changes from low to high, the count and code register 219 is signalled. It is the function of the count and code register simply to count the number of times which the state of output lead 217 changes from low to high during a given coding cycle. In this manner, it takes note of exactly how many times switch 207 is closed, and therefore how many redistributions between the capacitive divider and capacitor 211 take place.

With each successive redistribution between capacitor 211 and the charged divider, the voltage at the lower limit lead 204 is halved. Therefore, each time the voltage at the lower limit lead changes, the output voltage on the comparator 201 may possibly be changed, depending upon the magnitude of the lower limit voltage relative to the magnitude of the analog sample. Whenever the voltage at lower limit lead 204 finally does fall below the analog sample voltage, the output voltage of the comparator 201 is changed to its low state, inhibiting the AND gate 205 and thereby preventing subsequent redistributions. Square wave flip-flop 216 is, at this point, locked with its output lead 218 high and output lead 217 low. Therefore, whenever the lower limit voltage falls below the analog sample voltage, the count and code register may be considered to have determined automatically the segment of the characteristic of FIG. 1A in which the sample occurs. This follows from the fact that the states of the stages of the count and code register 219 is a binary code representation of the number of redistributions which have occurred between the capacitive divider and capacitor 211. Thus, this number is digitally encoded and is conveyed as an output signal to the transmission medium, either by shifting the pulses out of the register or by reading the N stage states in parallel.

The upper and lower limit voltages are then transmitted to the PCM converter, thereby delineating the segment of the characteristic of FIG. 1A in which the analog sample occurs. Although the characteristic of FIG. 1A is depicted for a three-digit code (resulting in a chord law characteristic of eight segments for positive signals and eight segments for negative signals), any number of digits may be utilized, depending upon the degree of accuracy required. The converter then employs a standard PCM conversion, and conveys the PCM code to the transmission medium for transmission along with the previously synthesized digits representing the designated segment of the chord characteristic.

The principles of the present invention may be applied with similar advantage to PCM decoders. In fact, the embodiment shown in FIG. 2 would need only minor adjustments to allow it to work in conjunction with PCM decoders. In the alternative, a relatively simple pulse gating system may be substituted for the count and code and start pulse operations of FIG. 2.

Figure 3:
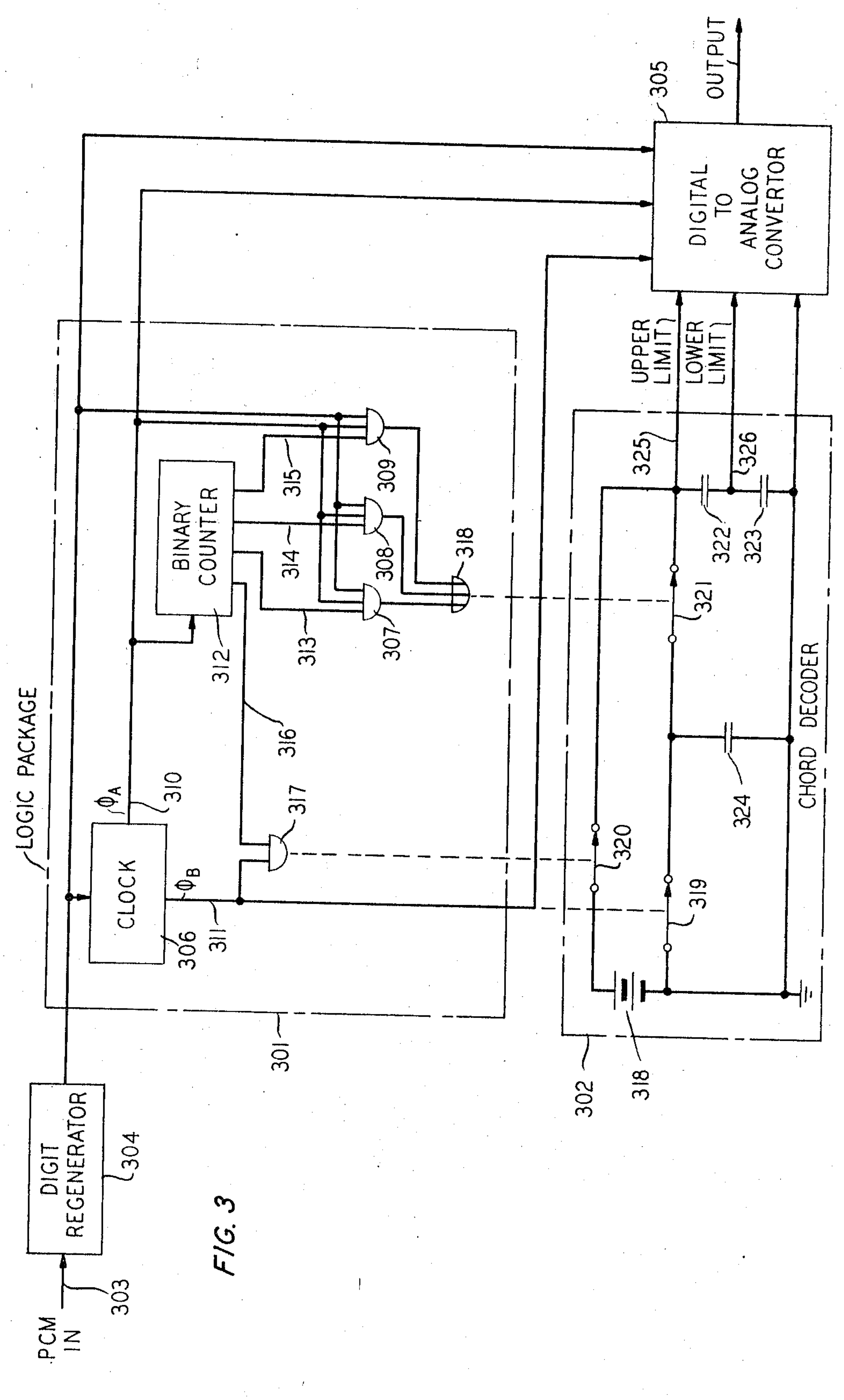
FIG. 3 is a schematic diagram of an illustrative embodiment of the present invention as applied to PCM decoders.

An embodiment of the present invention which uses pulse gating is shown in FIG. 3. For convenience of explanation, the embodiment of FIG. 3 is divided into two main parts designated as a logic package 301 and a chord decoder 302. The chord decoder section 302 is identical in operation to the capacitive portion of the embodiment of FIG. 2. This will be discussed more fully hereinafter. The logic package 301 functionally takes the place of the square wave flip-flop 216, the count and code register 219, and the start pulse circuit 203 of the embodiment of FIG. 2. It is the logic package 301 which contains the pulse gating apparatus which controls the switches in the chord decoder 302.

Incoming digits including the digits synthesized by the precoding embodiment of FIG. 2, as well as the PCM digits synthesized by the PCM encoder, are received at input terminal 303. After passing through a digit regenerator 304, the appropriate digits are passed onto the logic package 301 and the rest of the digits to a digital-to-analog converter 305. The digital-to-analog converter may be embodied variously. One example of a decoder which may advantageously utilize the principles of the present invention is shown in another patent application of R.L. Carbrey, Ser. No. 889,399 filed on Dec. 31, 1969. The digit regenerator 304 passes the digits which represent the segmenting characteristics to the logic package 301 one at a time, and each digit is individually considered by the logic package 301. As a digit is emitted by the digit regenerator 304, it is transmitted to a series of AND gates 307, 308, and 309. Timing information from the digit regenerator 304 is passed to the two-phase clock to synchronize that clock.

The two-phase clock 306 may be thought of as emitting two interleaved series of pulses, one series with a phase designated as $\Phi_A$ being produced at output terminal 310 and a second series of pulses with a different phase $\Phi_B$ being produced at output terminal 311. The pulses of the pulse train of phase $\Phi_A$ are transmitted to a binary counter 312, as well as to the three gates 307, 308, and 309. Three output leads from the binary counter 312, 313, 314, and 315, also go to the three gates 307, 308, and 309. Moreover, the clock pulses of phase $\Phi_B$ are gated with signals from output lead 316 of binary counter 312 through an AND gate 317. The outputs of the AND gates 307, 308, and 309 go to an OR gate 318.

Briefly, the chord decoder section 302 comprises a reference voltage source 318, three switches 319, 320, and 321, a capacitive divider comprising two capacitors 322 and 323, and a single capacitor 324. These portions of the chord decoder 302 are directly analogous to the capacitors, switches, and reference source of the embodiment of FIG. 2.

The characteristics of the three AND gates 307, 308, and 309 are somewhat distinctive. Unlike most AND gates, which either emit a pulse or hold a voltage level whenever enabled, the AND gates 307, 308, and 309 are designed to emit a specific number of pulses whenever they are enabled. In particular, gate 307 emits four pulses when enabled, gate 308 emits two pulses when enabled, and AND gate 309 emits one pulse when enabled. This number of pulses corresponds to the number of redistributions which it is intended to produce.

Switch 320, operating under the control of AND gate 317, is closed at the beginning of each decoding cycle, thereby charging the capacitive divider of capacitors 322 and 323 to the voltage of the reference voltage source 318. Switch 319 is controlled by the clock pulses of phase $\Phi_B$, alternatively opening and closing each time a clock pulse occurs. Thus, each time switch 319 is closed, capacitor 324 is discharged to ground. Switch 321 operates under the control of pulses from OR gate 318. Each time OR gate 318 is enabled, switch 321 is closed, causing capacitor 324 to be connected in parallel with the capacitive divider. Since AND gates 307, 308, and 309 are controlled by clock pulses of phase $\Phi_A$, switch 321 may only be closed at a time in which switch 319 is open. Thus, each time OR gate 318 is enabled, charge redistributes between the capacitive divider and capacitor 324. For example, if switch 318 is enabled by pulses from AND gate 307, switch 321 is opened and closed four times, thereby causing four charge redistributions between the capacitive divider and capacitor 324. Due to the interleaving of the two-phase clock pulses, capacitor 324 in discharged immediately after each redistribution. Four redistributions would reduce the upper limit voltage on lead 325 to $1/16V_r$ and the lower limit voltage on lead 326 to $1/32V_r$.

The binary counter 312 causes AND gate 307 to be enabled upon the occurrence of a $\Phi_A$ clock pulse if the first segment-indicating digit is a "1," and to remain disabled if the first segment-indicating digit is a "0." Similarly, AND gates 308 and 309 correspond to the second and third segment-indicating digits. Thus, when each of the segment-indicating digits have been so considered (three digits for this particular embodiment), a certain number of redistributions have taken place and the voltage at upper limit lead 325, and at lower limit lead 326 are conveyed to the digital-to-analog converter 305 for use as segment-indicating reference voltages.

The foregoing embodiments of the present invention are intended to be illustrative of the principles of the invention. Numerous other embodiments may occur to workers skilled in the art without departing from the spirit and scope of the invention.

What is claimed is:

1. Apparatus for specifying the segment of an analog signal range within which an analog sample occurs comprising:
   - first and second capacitors series connected as a voltage divider with an intermediate point, one side of said second capacitor being fixed at a datum voltage;
   - means for charging said voltage divider to a reference voltage;
   - means for comparing the voltage on said second capacitor with the analog sample voltage;
   - means including a third capacitor for periodically removing one-half the charge stored on said voltage divider, the charge removals continuing until the voltage at the intermediate point of said divider is smaller than the analog sample voltage; and
   - means for digitally counting the number of charge removals conducted by said means for removing, the state of the digital count whenever the charge removals are terminated representing said segment of the analog signal range, the voltage at said intermediate point of said divider defining the bottom limit of the segment and the voltage at the side of said first capacitor other than said intermediate point defining the top limit of the segment.

2. In a system in which analog type signals and digital type signals are converted, one to the other, a sample at a time, means for finding a segment of the analog signal amplitude range within which an analog sample occurs and for transferring information representative of the segment to a signal conversion means comprising:
   - a source of timing pulses;
   - a reference voltage source;
   - a source of signals to be converted;
   - first and second capacitors connected in series, one terminal of said second capacitor being grounded;
   - means under control of the timing pulses for charging the series combination of said first and second capacitors to the reference voltage;
   - means for removing charge from the series combination of said first and second capacitors comprising a third capacitor, switching means for connecting said third capacitor between ground and the series combination of said first and second capacitors, and means under the control of timing pulses and responsive to the signals to be converted for actuating said switching means;
   - means for comparing the voltage on said second capacitor with the analog sample voltage;
   - means responsive to said comparison means for stopping the activation of said switching means when the voltage on said second capacitor is less than the analog sample voltage; and
   - means for counting the number of times that said switching means is actuated;
   - the voltages at either end of said capacitor respectively defining the upper and lower limits of the segment of the analog signal range in which the analog sample occurs.

3. Apparatus as claimed in claim 3 wherein said means for actuating said switching means comprises
   - means, under the control of timing pulses and responsive to said comparison means, for switching said switching means between ground and the series combination of said first and second capacitors.

4. Apparatus as claimed in claim 2 wherein said means for actuating said switching means comprises a plurality of gating means, each of said gating means corresponding to one digit of a digital word, said switching means being operated whenever said gating means is enabled, and means, under the control of timing pulses, for synchronizing the operation of said gating means.

* * * * *